(12) United States Patent
Mitsuda

(10) Patent No.: US 7,521,986 B2
(45) Date of Patent: Apr. 21, 2009

(54) SWITCH ELEMENT DRIVER CIRCUIT AND SEMICONDUCTOR DEVICE

(75) Inventor: Tsuyoshi Mitsuda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 123 days.

(21) Appl. No.: 11/808,955

(22) Filed: Jun. 14, 2007

(65) Prior Publication Data

US 2008/0013760 A1    Jan. 17, 2008

(30) Foreign Application Priority Data

Jun. 21, 2006    (JP)    ............................. 2006-171641

(51) Int. Cl.
    *G11C 5/14*    (2006.01)
    *H03B 1/00*    (2006.01)
    *H03B 23/00*    (2006.01)
    *H03K 3/00*    (2006.01)

(52) U.S. Cl. .................... 327/530; 327/108; 331/47; 331/57; 331/150; 331/178

(58) Field of Classification Search ................ 327/100, 327/108, 109, 365, 387, 427, 530, 548; 331/46, 331/47, 57, 74, 75, 78, 106, 150, 178

See application file for complete search history.

(56) References Cited

U.S. PATENT DOCUMENTS

| 7,180,271 | B2 | 2/2007 | Takahashi et al. |
| 2006/0202741 | A1* | 9/2006 | Tran et al. .................... 327/536 |

FOREIGN PATENT DOCUMENTS

JP    2005-312247 A    11/2005

* cited by examiner

*Primary Examiner*—David Mis
(74) *Attorney, Agent, or Firm*—Foley & Lardner LLP

(57) ABSTRACT

Noise generation is reduced further. Oscillation control circuit 11 generates a modulation signal modulating oscillation frequency of an oscillation signal generated by oscillation circuit 12 and outputs modulation signal to same. Preferably, the modulation signal fluctuates period of the oscillation signal sequentially. The oscillation circuit 12 is composed of a ring oscillator, for example, and the power supply voltage or power supply current of the ring oscillator is controlled to fluctuate sequentially by the modulation signal output from the oscillation circuit 11. Buffer 14 of charge pump circuit 13 generates signals /Φ and Φ by the oscillation signal and drives capacitors C1 and C2 for supplying a higher voltage than the voltage of the power supply Vcc to gate of N-channel MOSFET Q1.

7 Claims, 8 Drawing Sheets

SWITCH ELEMENT DRIVER CIRCUIT AND SEMICONDUCTOR DEVICE

RELATED APPLICATION

This application is based upon and claims the benefit of the priority of Japanese patent application No. 2006-171641, filed on Jun. 21, 2006, the disclosure of which is incorporated herein in its entirety by reference thereto.

FIELD OF THE INVENTION

This invention relates to a switch element driver circuit and a semiconductor device including the same, and particularly relates to a high-side switch driver circuit and a semiconductor device including the same.

BACKGROUND OF THE INVENTION

In a vehicle such as an automobile, electrical loads such as lamps or motors are usually installed at low-side, since a chassis of the vehicle has a ground potential in general. Then, high-side switches, in which the loads are connected between the switches and the ground, are often used, and also N-channel MOSFETs that operate as source followers are often used as switch elements due to their low on-resistance characteristics and low cost.

It is necessary to apply a higher gate voltage than the power supply voltage to drive a high-side switch composed of the N-channel MOSFET that operates as a source follower. For this purpose, a step-up circuit is needed. A typical circuit for the step-up circuit is known as a charge pump circuit. An oscillation circuit is provided in the charge pump circuit to receive/transfer electric charges charged in capacitors.

Besides that, it is necessary to reduce incoming noises for electronic devices in general. For example, an incursion of noises to an AM band (531 to 1602 kHz) or traffic information service (1620 kHz) causes a problem to devices on-vehicle such as a radio receiver.

Therefore, a system to reduce incoming noises is required. For example, Patent Document 1 discloses a generation control device for a vehicle that reduces noises occurred from a charge pump circuit. The generation control device for a vehicle is formulated so as to provide a low frequency of an oscillation signal to drive the charge pump circuit under predetermined conditions. The predetermined conditions are determined as follows: when a magnetic field current detected by a magnetic field current detecting circuit is lower than a predetermined threshold of the magnetic field current, when a conducting time of a switching element detected by a conducting time detecting circuit is lower than a predetermined threshold of the conducting time, and when an induced voltage of a stator coil detected by an induced voltage detecting circuit is lower than a predetermined threshold of the induced voltage. In addition, a lowered frequency of 400 kHz of an oscillation signal is shown, as an exampled, compared to a rectangular wave of 800 kHz of initial oscillation frequency.

[Patent Document 1]
JP Patent Kokai Publication No. JP-P2005-312247A

SUMMARY OF THE DISCLOSURE

The entire disclosure of Patent Document 1 is incorporated herein by reference thereto.

The generation control device for a vehicle in Patent Document 1 reduces noises by lowering a frequency of the oscillation signal to drive the charge pump circuit. When the lowered frequency is 400 kHz, for example, the noises do not directly disrupt broadcasting of AM band. However, since the oscillation signal is a continuous rectangular wave having a constant period, there are line spectra of high harmonics besides fundamental wave of the oscillation signal. The harmonic components also disrupt the AM band broadcasting, although levels of the harmonics are low. That is, conventional devices still have problems of noises.

According to an aspect of the present invention there is provided a switch element driver circuit comprising a charge pump circuit generating a voltage supplied to a control end of a switch element; an oscillation circuit outputting a driving signal to operate the charge pump circuit to the charge pump circuit; and an oscillation control circuit controlling the oscillation circuit to fluctuate period of the driving signal sequentially.

The meritorious effects of the present invention are summarized as follows. According to the present invention, since the frequency of an oscillation signal to drive a charge pump circuit is controlled to fluctuate, line spectra of concentrated energy are not contained in noise signals occurred from a switch element driver circuit. Therefore, it becomes possible to reduce noises further that influence other electronic devices.

PREFERRED MODES OF THE INVENTION

The oscillation control circuit may generate a modulation signal to modulate an oscillation frequency of the oscillation circuit and output to the oscillation circuit.

The oscillation control circuit may generate one of a triangle wave signal, a sine wave signal, a sawtooth wave signal, a random signal, a pseudo-random signal and a combination signal of these signals as the modulation signal.

The oscillation circuit may comprise a ring oscillator having multistage-connected inverter circuits and at least one of voltage and current of a power supply of at least a part of the multistage-connected inverter circuits is controlled to fluctuate by the oscillation control circuit.

Further, there is provided a semiconductor device comprising the switch element driver circuit.

The semiconductor device may further comprise the switch element, wherein the switch element may be composed of an NMOS transistor that functions as a high-side switch.

Figure 1:
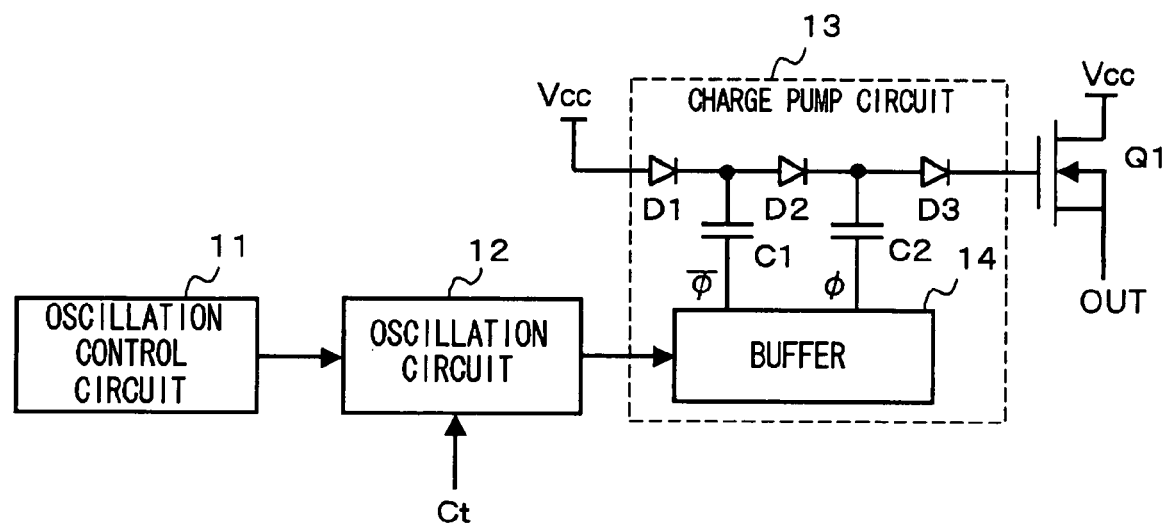
FIG. 1 is a block diagram of a structure of a switch element driver circuit according to an example of the present invention.

FIG. 1 is a block diagram showing a structure of a switch element driver circuit according to an example of the present invention. The switch element driver circuit shown in FIG. 1 includes an oscillation control circuit 11, an oscillation circuit 12 and a charge pump circuit 13 and the circuits drive a gate terminal of an N-channel MOSFET Q1 that functions as a high-side switch.

The oscillation control circuit 11 generates a modulation signal that modulates oscillation frequency of an oscillation signal generated at the oscillation circuit 12 and outputs the modulation signal to the oscillation circuit 12. It is preferred that the modulation signal is controlled so that the period of the oscillation signal fluctuates sequentially (do not stay constant) by the modulation signal. Particularly, the fluctuated modulation signal whose amplitudes distribute within a fixed range is preferable. For example, one of such signals as triangle wave signal, sine wave signal, sawtooth wave signal, random signal and pseudo-random signal or a combination signal of these signals is preferably usable.

The oscillation circuit 12 is composed of a ring oscillator in which multistage inverter circuits are connected, for example. A part or all of the voltages and/or currents of the power supply of the multistage inverter circuits are controlled to fluctuate sequentially by the modulation signal output from the oscillation circuit 11. Generation of a driving signal to drive the charge pump circuit 13 is controlled by a control signal Ct and the driving signal whose period sequentially fluctuates is output to the charge pump circuit 13.

The charge pump circuit 13 includes diodes D1, D2, D3, capacitors C1, C2 and a buffer 14. The diodes D1, D2 and D3 are cascaded in series from a power supply Vcc to the gate terminal of the N-channel MOSFET Q1 in the forward direction. The capacitor C1 is connected between a connecting point of the diodes D1 and D2 and the buffer 14. The capacitor C2 is connected between a connecting point of the diodes D2 and D3 and the buffer 14. The buffer 14 generates signals /Φ and Φ, whose phases are inverted from one another, by the driving signal output from the oscillation circuit 12 and the signals /Φ and Φ drive the capacitors C1 and C2. Charged voltages of capacitors C1 and C2, which are charged via the diodes D1, D2 and D3, are boosted sequentially by the signals Φ and /Φ and supplied to the gate terminal of the N-channel MOSFET Q1. Then a voltage of the gate of the N-channel MOSFET Q1 becomes higher than a voltage of the power supply Vcc and the N-channel MOSFET Q1 is activated to output the voltage of the power supply Vcc from an output OUT.

In the switch element driver circuit of the structure described above, the period of the oscillation signal to drive the charge pump circuit 13 is controlled to fluctuate sequentially by the modulation signal. Therefore, no fundamental wave or line spectrum of harmonic is contained in the oscillation signal from the oscillation circuit 12 and then it becomes possible to reduce noises that influence other electronic devices.

EXAMPLE 1

Figure 2:
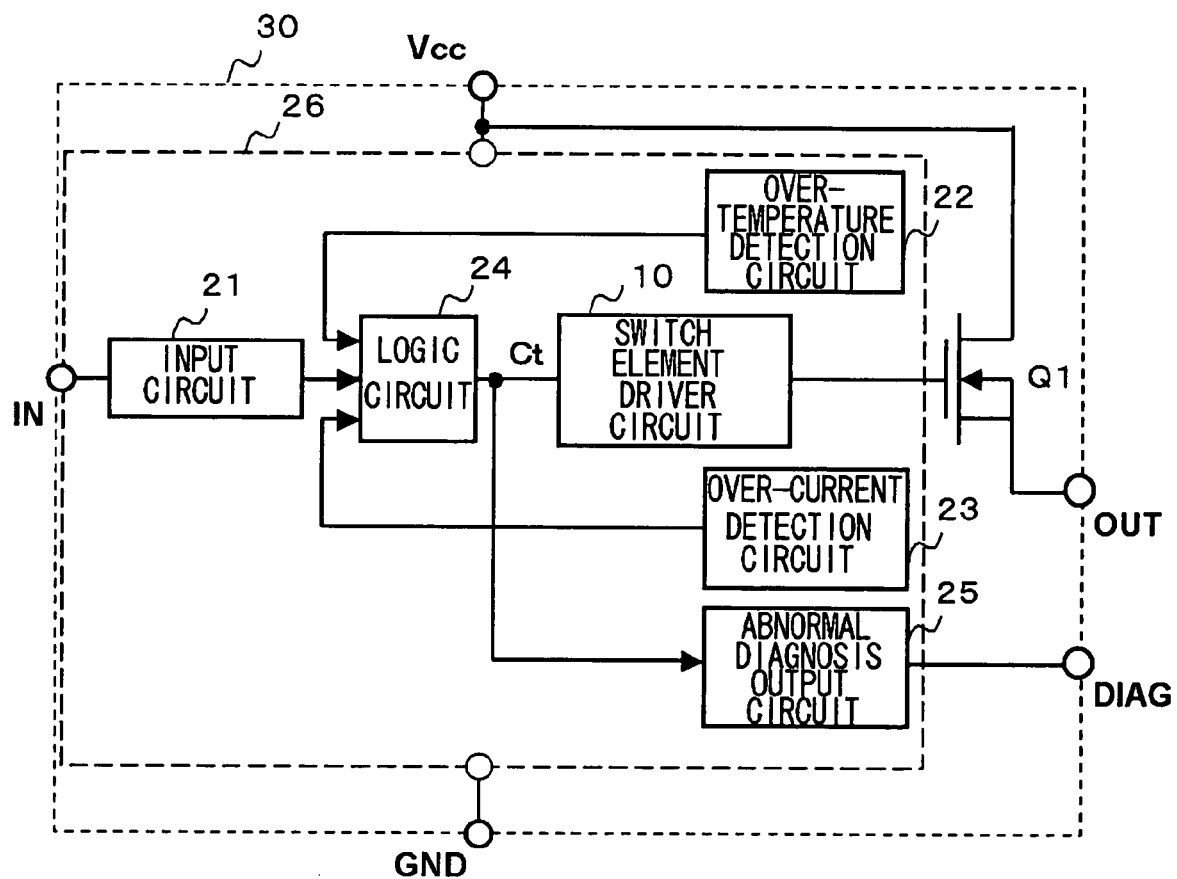
FIG. 2 is a block diagram of a structure of a semiconductor device according to a first example of the present invention.

FIG. 2 is a block diagram of a structure of a semiconductor device according to a first example of the present invention. The semiconductor device shown in FIG. 2 includes the switch element driver circuit 10 shown in FIG. 1, an input circuit 21, an over-temperature detection circuit 22, an over-current detection circuit 23, a logic circuit 24 and an abnormal diagnosis output circuit 25, etc. and functions as a high-side switch driver semiconductor device. The input circuit 21 converts the level of a signal, which is input from an input terminal IN and controls stop operation of the switch element driver circuit 10, and outputs to the logic circuit 24. The over-temperature detection circuit 22 detects an over-temperature of the semiconductor device. The over-current detection circuit 23 detects an over-current of the N-channel MOSFET Q1. The logic circuit 24 not only outputs control signal Ct to control operation or stop of the switch element driver circuit 10 based on the outputs of the input circuit 21, the over-temperature detection circuit 22 and the over-current detection circuit 23 but also outputs abnormal diagnosis information of the over-temperature and/or over-current to the abnormal diagnosis output circuit 25. The abnormal diagnosis output circuit 25 outputs the abnormal diagnosis information from a terminal DIAG to outside.

The semiconductor device of the structure described above can be composed as a monolithic-chip semiconductor device 26. Further, it can include the N-channel MOSFET Q1 resulting in a semiconductor device 30 structured by multi-chips or monolithic-chip. The N-channel MOSFET Q1, whose drain is connected to the power supply terminal Vcc and whose source is connected to the output terminal OUT that is connected to a load, is controlled on and off by the switch element driver circuit 10 which is connected to the gate of the N-channel MOSFET Q1.

Figure 3:
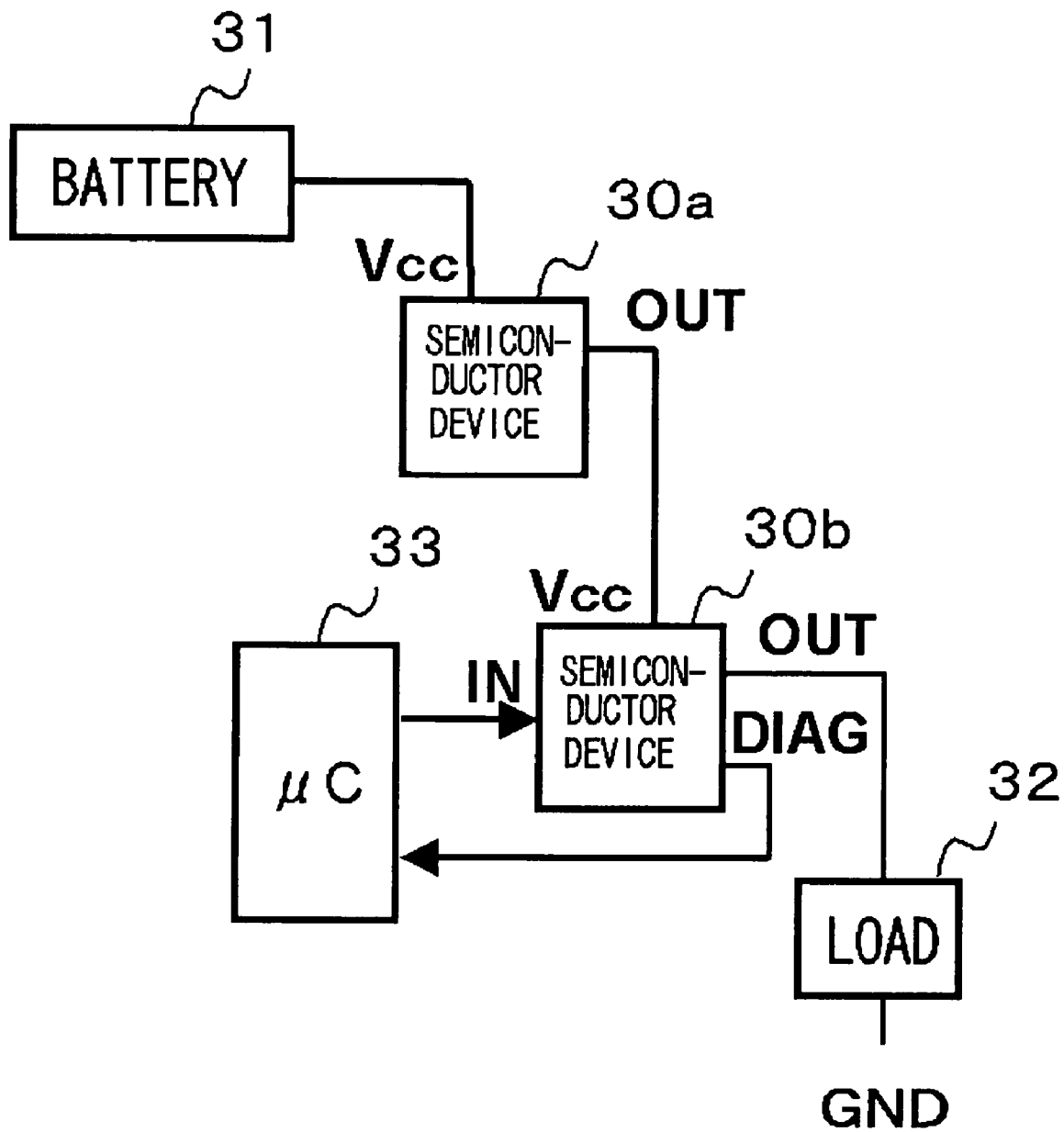
FIG. 3 is a block diagram of the exemplary structure of the semiconductor device shown in FIG. 2 applied as a high-side switch device for a vehicle.

FIG. 3 is a block diagram of an exemplary structure of the semiconductor device 30 shown in FIG. 2 applied as a high-side switch device for a vehicle. Each of semiconductor devices 30a and 30b in FIG. 3 is the same as the semiconductor device 30 in FIG. 2 and both of them are connected in series between a battery 31 and a load 32 which may be such as a lamp or a motor, etc. The semiconductor device 30a is an auxiliary device for fail-safe and usually on. The semiconductor device 30b is controlled on and off by a microprocessor 33. The microprocessor 33 observes a signal output from the terminal DIAG of the semiconductor device 30b and transmits a signal to an input terminal IN to control the semiconductor device 30b off when an abnormal diagnosis information signal is output from the terminal DIAG.

According to the high-side switch device of the structure described above, no line spectrum is contained in noise components occurred in the semiconductor devices 30a and 30b. Therefore, the influence of noises on a radio-on-vehicle for AM band broadcasting or traffic information is reduced when such high-side switches are mounted on the vehicle.

EXAMPLE 2

Figure 4:
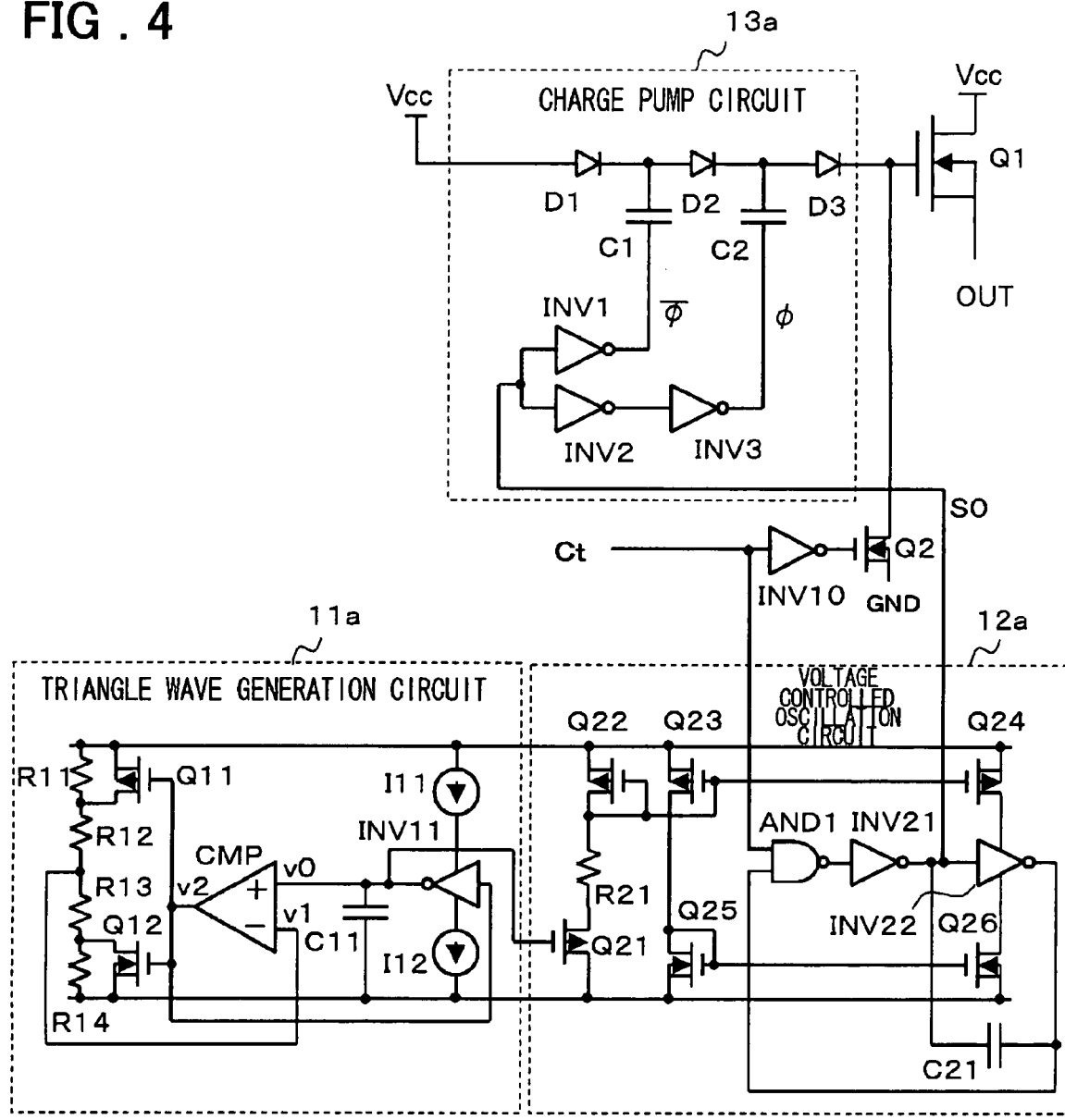
FIG. 4 is a circuit diagram of a switch element driver circuit according to a second example of the present invention.

FIG. 4 is a circuit diagram of a switch element driver circuit according to a second example of the present invention. In FIG. 4, the switch element driver circuit includes a triangle wave generation circuit 11a, a voltage controlled oscillation circuit 12a, a charge pump circuit 13a, an inverter INV10 and an N-channel MOSFET Q2. The triangle wave generation circuit 11a generates a triangle signal to control the voltage controlled oscillation circuit 12a so that the period of driving signal generated by the voltage controlled oscillation circuit 12a fluctuates sequentially. The voltage controlled oscillation circuit 12a is a ring oscillator, in which generation or ceasing of a driving signal to operate the charge pump circuit 13a is controlled by the control signal Ct, and outputs the generated driving signal to the charge pump circuit 13a. The charge pump circuit 13a generates a voltage supplied to the gate terminal of the N-channel MOSFET Q1 functions as a high-side switch.

The triangle wave generation circuit 11a is described at first. The triangle wave generation circuit 11a includes a voltage comparison circuit CMP, current sources I11 and I12, an inverter circuit INV11, a P-channel MOSFET Q11, an N-channel MOSFET Q12, resistances R11, R12, R13 and R14 and a capacitor C11. An output terminal of the voltage comparison circuit CMP is connected to each gate of the P-channel MOSFET Q11 and the N-channel MOSFET Q12, and to an input terminal of the inverter circuit INV11. Source of the P-channel MOSFET Q11 is connected to one end of the resistance R11 and the power supply Vcc, and drain of the P-channel MOSFET Q11 is connected to the other end of the resistance R11 and one end of the resistance R12. Source of the N-channel MOSFET Q12 and one end of the resistance R14 are grounded, and drain of the N-channel MOSFET Q12 and the other end of the resistance R14 are connected to one end of the resistance R13. Both of the other ends of the resistances R12 and R13 are commonly connected to an inverting input terminal (−) of the voltage comparison circuit CMP. The power supply side of the inverter circuit INV11 is driven by the current source I11 and the ground side is driven by the current source I12. An output terminal of the inverter circuit INV11 is connected to one end of the capacitor C11, of which the other end is grounded, and a non-inverting input terminal (+) of the voltage comparison circuit CMP.

Assume that voltage v2 of the output terminal of the voltage comparison circuit CMP in the triangle wave generation circuit 11a of such a structure is at high level. Then, the P-channel MOSFET Q11 turns off and the N-channel MOSFET Q12 turns on with the result that voltage v1 of the inverting input terminal (−) of the voltage comparison circuit CMP becomes a low voltage, which is the Vcc voltage divided by the ratio of resistance value R13 to the sum of resistance values R11, R12 and R13. On the other hand, since the input terminal of the inverter circuit INV 11 is v2 and at high level, the charged electricity (charges) of the capacitor C11 is discharged through current source I12 and voltage v0 of the capacitor C11 declines linearly to the ground.

When the voltage v0 becomes lower than the voltage v1, the voltage v2 of the output terminal of the voltage comparison circuit CMP is inverted to low level. At this time, the P-channel MOSFET Q11 becomes on and the N-channel MOSFET Q12 becomes off with the result that a voltage v1 of the inverting input terminal (−) of the voltage comparison circuit CMP becomes a high voltage, which is the Vcc voltage divided by the ratio of the sum of resistance values R13 and R14 to the sum of resistance values R12, R13 and R14. On the other hand, since the input terminal of the inverter circuit INV 11 is at low level, the charged electricity of the capacitor C11 is charged via current source I11 and the voltage v0 of the capacitor C11 increases linearly to the supply voltage. When the voltage v0 becomes over the voltage v1, the voltage v2 of the output terminal of the voltage comparison circuit CMP is inverted to high level and returns to the initial state.

The triangle wave generation circuit 11a operates in this way and outputs a signal containing the voltage v0 fluctuating as triangle waves to the voltage controlled oscillation circuit 12a. When one of the current sources I11 or I12 is short-circuited, the capacitor C11 is quickly charged or discharged and the voltage v0 fluctuates as a sawtooth wave.

Next, the voltage controlled oscillation circuit 12a is explained. The voltage controlled oscillation circuit 12a includes an AND circuit AND1, inverter circuits INV21 and INV22, P-channel MOSFETs Q21, Q22, Q23 and Q24, N-channel MOSFETs Q25 and Q26, a resistance R21 and a capacitor C21. A drain of the P-channel type MOSFET Q21 is connected to the ground, gate of which is connected to an output terminal of the inverter circuit INV11, and source of which is connected to gates of the P-channel MOSFETs Q22, Q23 and Q24 and to a drain of the P-channel MOSFET Q22 via the resistance R21. Sources of the P-channel MOSFETs Q22, Q23 and Q24 are connected to the power supply Vcc. Drain of the P-channel MOSFETs Q23 is connected to gates of the N-channel MOSFETs Q25 and Q26 and drain of the N-channel MOSFET Q25. Sources of the N-channel MOSFETs Q25 and Q26 are connected to the ground. Drain of the P-channel MOSFET Q24 is connected to the power supply side of the inverter circuit INV22 and drain of the N-channel MOSFET Q26 is connected to the ground side of the inverter circuit INV22.

The control signal Ct is input to one input terminal of the AND circuit AND1 and the other input terminal is connected to an output terminal of the inverter circuit INV22. An output terminal of the AND circuit AND1 is connected to an input terminal of the inverter circuit INV21 and an output terminal of the inverter circuit INV21 is connected to an input terminal of the inverter circuit INV22, one end of the capacitor C21 of which the other end is connected to the output terminal of the inverter circuit INV22 and the charge pump circuit 13a.

In the voltage controlled oscillation circuit 12a of such a structure, the AND circuit AND1 and inverter circuits INV21 and INV22 form a ring counter of which the oscillation is controlled on and off by the control signal Ct (it oscillates when the control signal Ct is at high level and stops when the Ct is at low level). The capacitor C21 determines the oscillation frequency of the ring counter. The P-channel MOSFETs Q22, Q23 and Q24 form a current mirror and the current is determined by the output voltage of the P-channel MOSFET Q21 to function as a source follower. In addition, the N-channel MOSFETs Q25 and Q26 also form a current mirror and the current is determined by the current flows in the P-channel MOSFET Q23. The currents of the P-channel MOSFET Q24 and the N-channel MOSFET Q26 control a slew rate of the inverter circuit INV22. Then the oscillation frequency of the ring counter is controlled. That is, the signal S0 (may be termed "driving signal") output from the inverter circuit INV21 is modulated by the voltage v0 fluctuated in triangle wave and controlled so that the period of the signal S0 sequentially fluctuates as a triangle wave.

The charge pump circuit 13a includes diodes D1, D2 and D3, capacitors C1 and c2 and inverter circuits INV1, INV2 and INV3, and since the circuit is equivalent to the charge pump circuit 13 in FIG. 1, the details are not described. The inverter circuits INV1, INV2 and INV3 correspond to the buffer 14 in FIG. 1. The signal S0 is inverted into /Φ by the inverter circuit INV1 and the signal /Φ drives one end of the capacitor C1. Further, the signal S0 is converted into Φ via the inverter circuits INV2 and INV3 and the signal Φ drives one end of the capacitor C2. The boosted voltage by the charge pump circuit 13a is supplied to the gate of the N-channel MOSFET Q1.

In addition, the inverter circuit INV10 inverts the control signal Ct and inputs to the gate of the N-channel MOSFET Q2. The source of the N-channel MOSFET Q2 is grounded and the drain is connected to the gate of the N-channel MOSFET Q1. When the control signal Ct is at high level, the voltage controlled oscillation circuit 12a oscillates and the N-channel MOSFET Q2 turns off. When the control signal Ct is at low level, the voltage controlled oscillation circuit 12a ceases the oscillation, the N-channel MOSFET Q2 turns on and the N-channel MOSFET Q1 turns off resulting that the voltage of the power supply Vcc is not output to the output terminal OUT.

Figure 5:
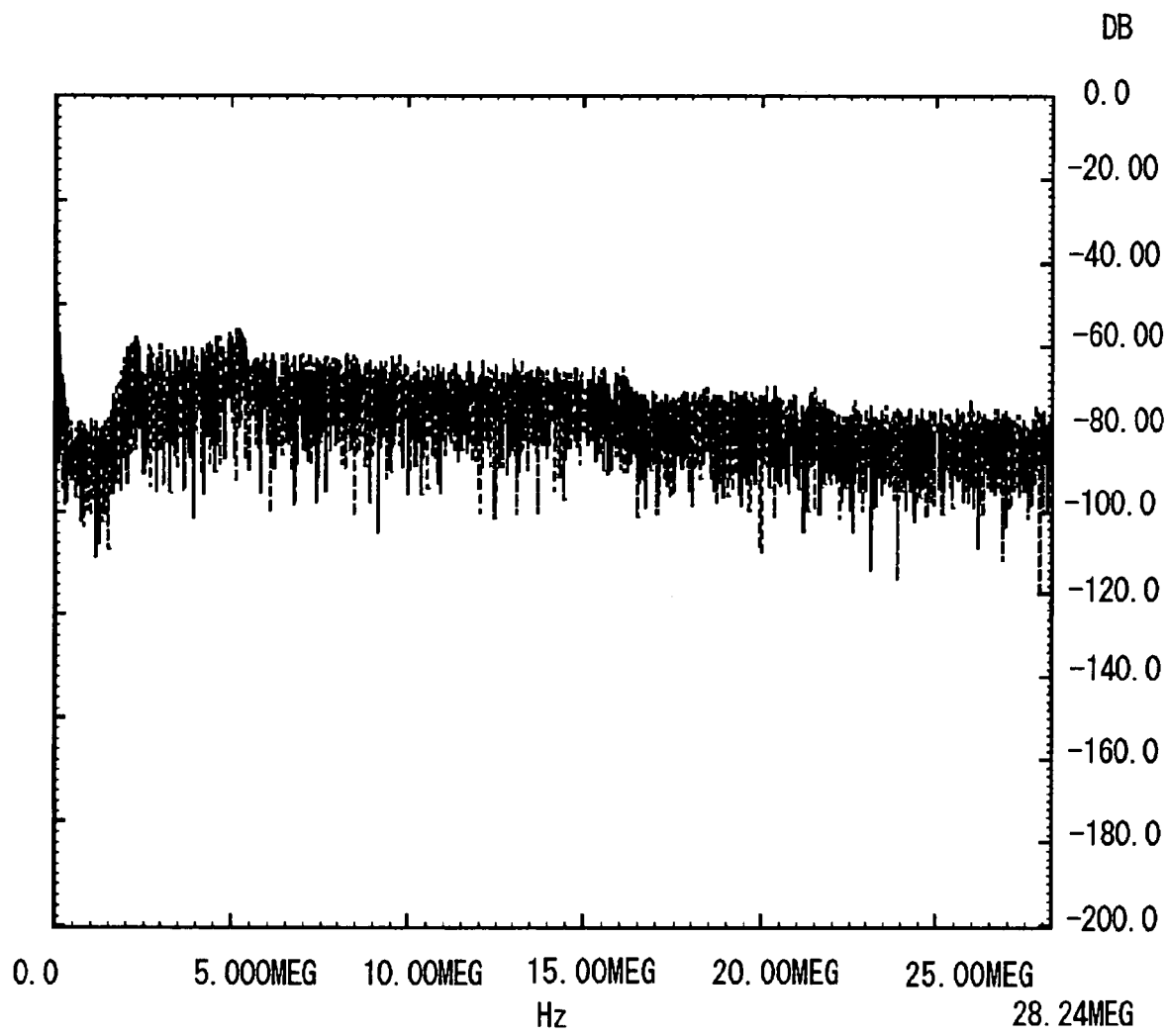
FIG. 5 is a graph that shows a relation between frequency and output of the switch element driver circuit according to the second example of the present invention.
Figure 6:
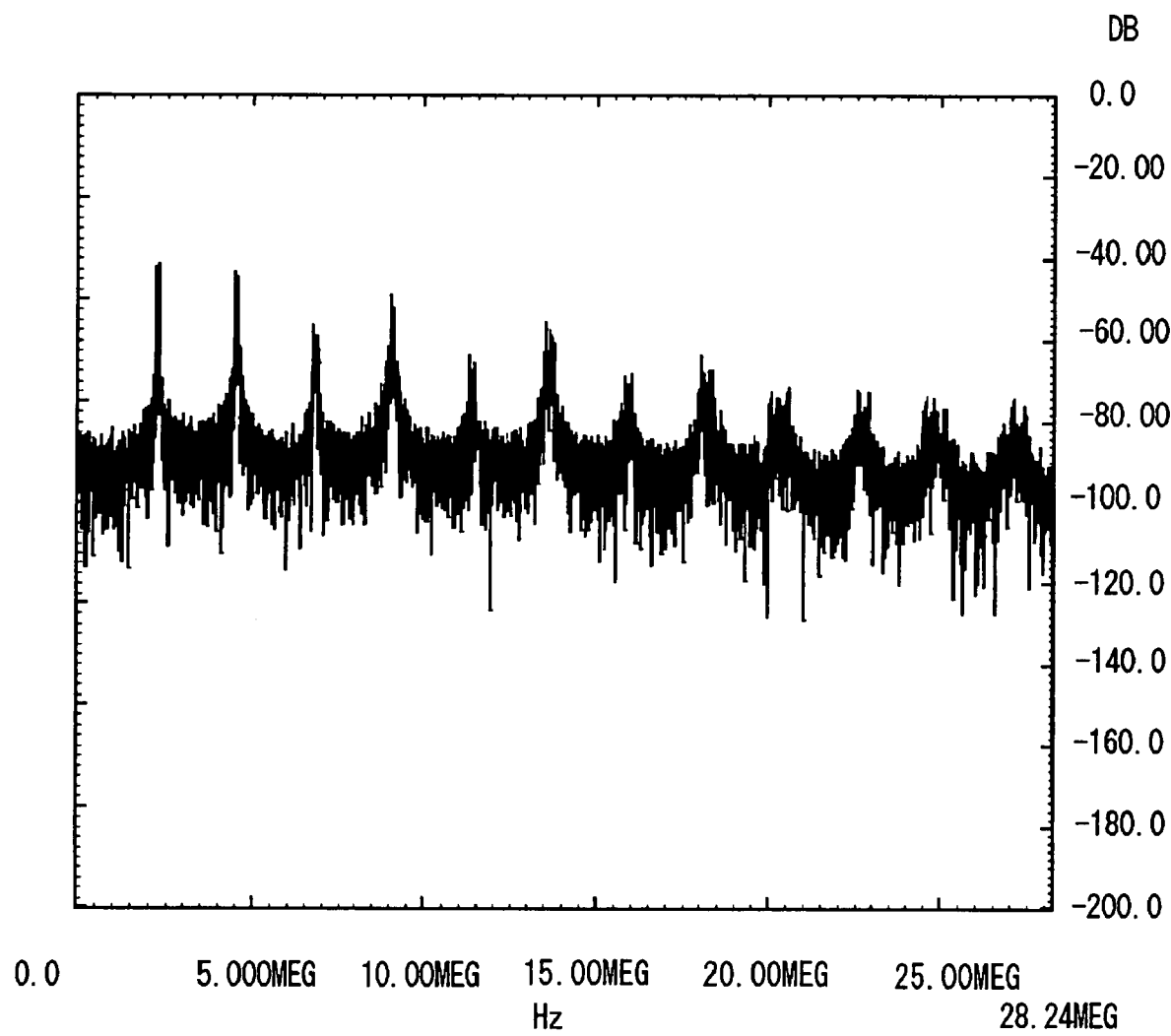
FIG. 6 is a graph that shows a relation between frequency and output of a conventional switch element driver circuit.

Next, the characteristics of output frequency of the switch element driver circuit of such a structure are explained. FIG. 5 and FIG. 6 are spectrum graphs of output frequency of the switch element driver circuits under the condition that the main oscillation frequency of the voltage controlled oscillation circuit 12a is 2.25 MHz. FIG. 5 shows an output frequency spectrum in the case where the triangle wave generation circuit 11a oscillates a triangle wave signal of 100 kHz frequency and the output signal of the voltage controlled oscillation circuit 12a is modulated by the triangle wave signal. FIG. 6 shows an output frequency spectrum in the case that the triangle wave generation circuit 11a ceases oscillation and the output signal of the voltage controlled oscillation circuit 12a oscillates rectangular wave signal with a constant period and it corresponds to the characteristics of output frequency of the conventional switch element driver circuit. Flat and low energy spectra are observed in FIG. 5, however, line spectra of 2.25 MHz and their harmonics having high energy are observed in FIG. 6.

According to the switch element driver circuit of the example, the oscillation signal does not contain line spectra of the fundamental wave and the harmonics and generation of the noise that influences other electrical devices can be reduced.

EXAMPLE 3

Figure 7:
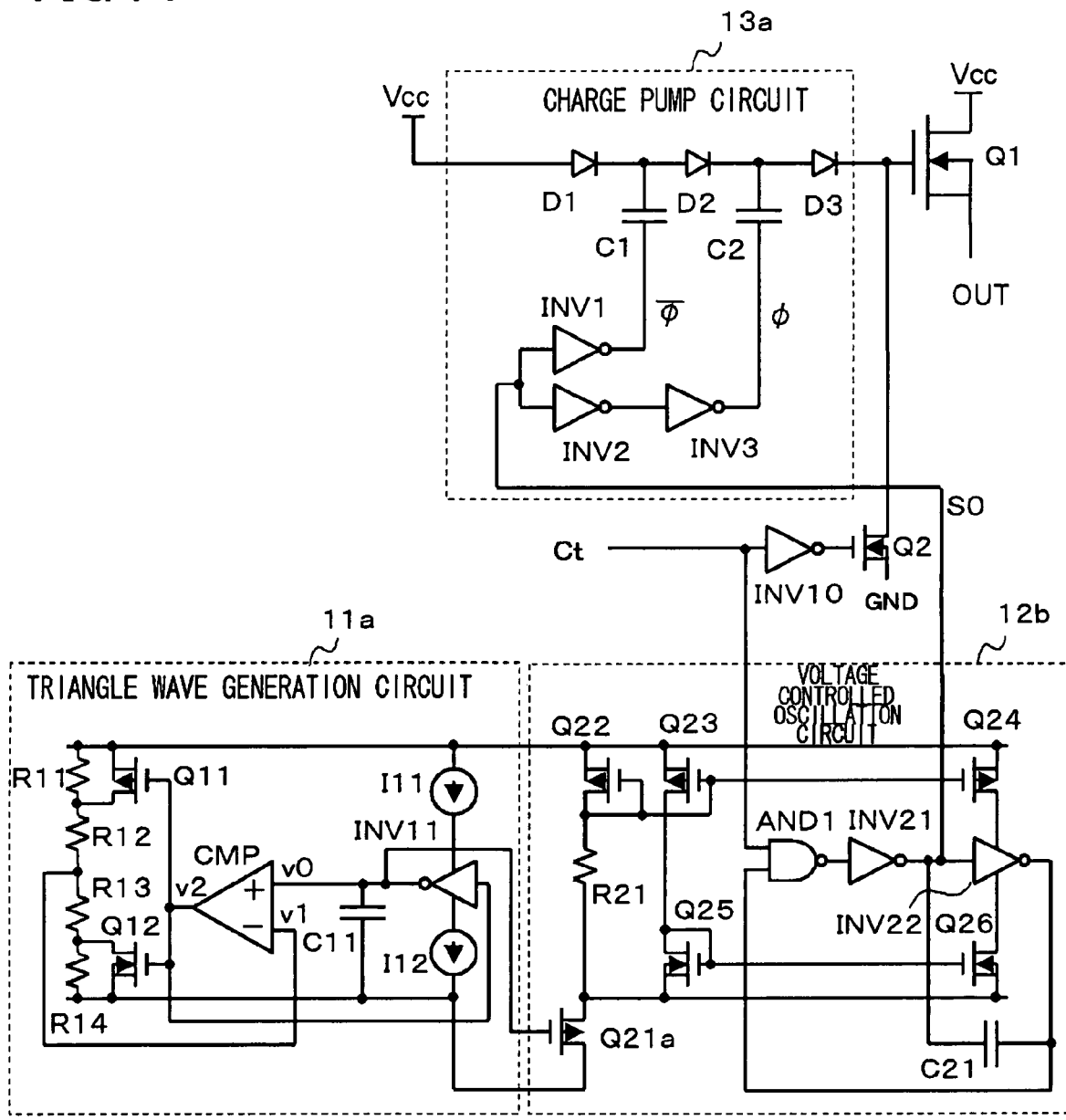
FIG. 7 is a circuit diagram of a switch element driver circuit according to a third example of the present invention.

FIG. 7 is a circuit diagram of a switch element driver circuit according to a third example of the present invention. In FIG. 7, the same symbols as those of FIG. 4 denote the same elements and the explanations are omitted. A voltage controlled oscillation circuit 12b includes a P-channel MOSFET Q21a instead of the P-channel MOSFET Q21 in the voltage controlled oscillation circuit 12a in FIG. 4. Source of the P-channel MOSFET Q21a is connected to one end of the resistance R21 and the sources of the N-channel MOSFETs Q25 and Q26. The voltage of the sources of the N-channel MOSFETs Q25 and Q26 fluctuates according to the voltage v0, which is generated by the triangle wave generation circuit 11a and fluctuates as a triangle wave, and controls the slew rate of the inverter circuit INV22. The oscillation frequency of the ring counter is controlled by the method as the example 2.

EXAMPLE 4

Figure 8:
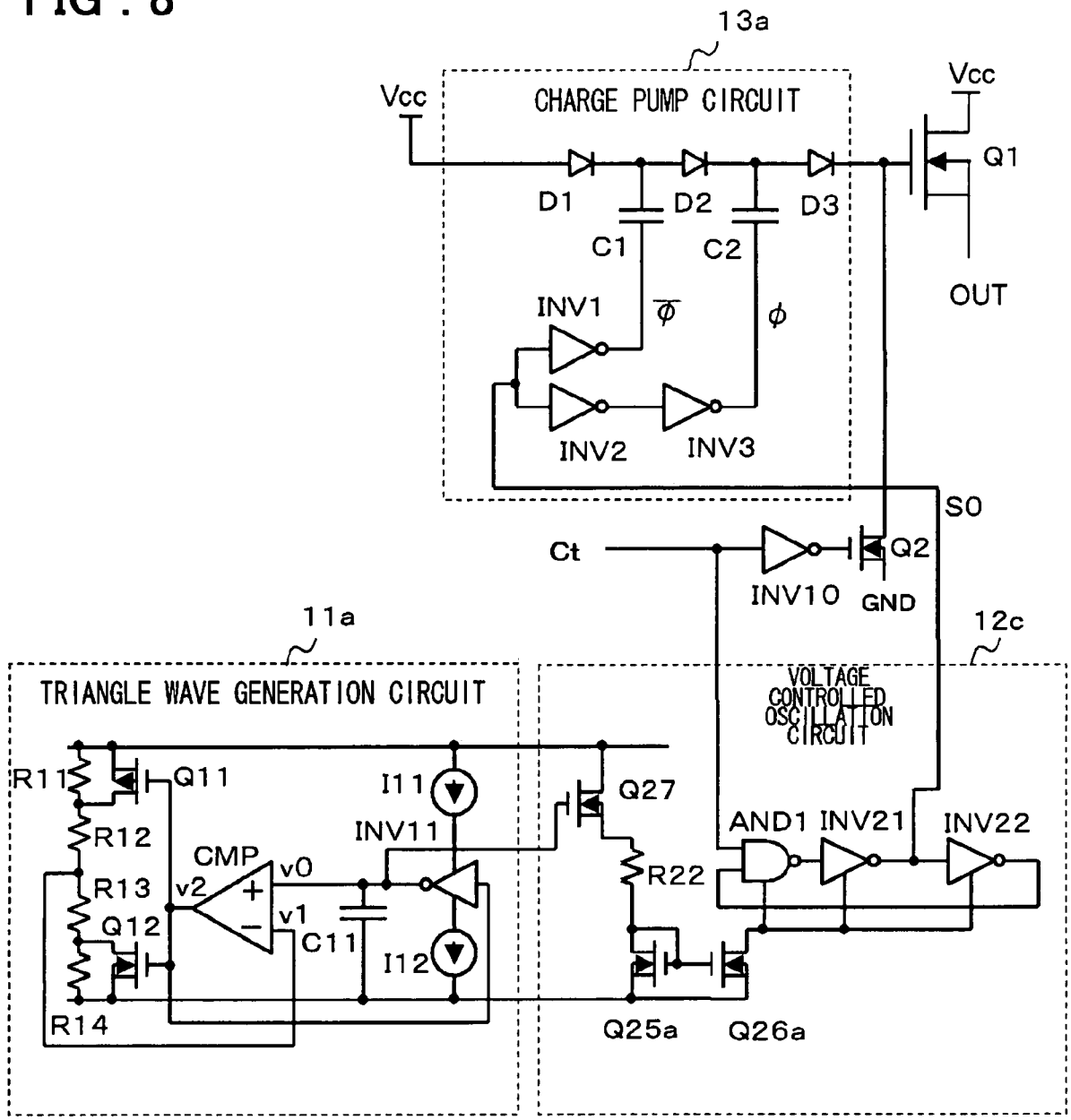
FIG. 8 is a circuit diagram of a switch element driver circuit according to a fourth example of the present invention.

FIG. 8 is a circuit diagram of a switch element driver circuit according to a fourth example of the present invention. In FIG. 8, the same symbols as those of FIG. 4 denote the same elements and the explanations are omitted. In a voltage controlled oscillation circuit 12c, the P-channel MOSFETs Q21, Q22, Q23 and Q24, the N-channel MOSFETs Q25 and Q26 and the resistance R21 in the voltage controlled oscillation circuit 12a in FIG. 4 are removed and P-channel MOSFET Q27, N-channel MOSFETs Q25a and Q26a and a resistance R22 are implemented. Drain of the N-channel MOSFET Q27 is connected to the power supply Vcc, gate of which is connected to the output terminal of the inverter circuit INV11, and source of which is connected to the gates of the N-channel MOSFETs Q25a and Q26a and to the drain of the N-channel MOSFET Q25a via the resistance R22. The sources of the N-channel MOSFETs Q25a and Q26a are grounded. The drain of the N-channel MOSFET Q26a is connected to the ground sides of the AND circuit AND1 and the inverter circuits INV21 and INV22.

According to the voltage controlled oscillation circuit 12c of such a structure, the voltage of the source of the N-channel MOSFET Q27 fluctuates by the signal having the voltage of v0, which is generated by the triangle wave generation circuit 11a and fluctuates as a triangle wave. Consequently, the drain current of the N-channel MOSFET Q26a, that is, the supply currents of the AND circuit AND1 and the inverter circuits INV21 and INV22 fluctuate. Therefore, the oscillation frequency of the ring counter formed by the AND circuit AND1 and inverter circuits INV21 and INV22 fluctuates like a triangle wave. Although a capacitor corresponding to the capacitor C21 in the voltage controlled oscillation circuit 12a in FIG. 4 does not exist in the voltage controlled oscillation circuit 12c, it is possible to oscillate the ring counter by several mega hertz, for example, by adjusting the fabrication process properly of the semiconductor device having the switch element driver circuit.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

What is claimed is:

1. A switch element driver circuit, comprising:
   a charge pump circuit that generates a voltage supplied to a control end of a switch element;
   an oscillation circuit that outputs a driving signal to operate said charge pump circuit to said charge pump circuit; and
   an oscillation control circuit that controls said oscillation circuit to fluctuate period of said driving signal sequentially.

2. The switch element driver circuit as defined in claim 1, wherein said oscillation control circuit generates a modulation signal to modulate an oscillation frequency of said oscillation circuit and output to said oscillation circuit.

3. The switch element driver circuit as defined in claim 2, wherein said oscillation control circuit generates one of a triangle wave signal, a sine wave signal, a sawtooth wave signal, a random signal, a pseudo-random signal and a combination signal of these signals as said modulation signal.

4. The switch element driver circuit as defined in claim 1, wherein said oscillation circuit comprises a ring oscillator having multistage-connected inverter circuits and at least one of voltage and current of a power supply of at least a part of said multistage-connected inverter circuits is controlled to fluctuate by said oscillation control circuit.

5. A semiconductor device comprising said switch element driver circuit as defined in claim 1.

6. The semiconductor device as defined in claim 5, further comprising said switch element.

7. The semiconductor device as defined in claim 6, wherein said switch element is composed of an NMOS transistor that functions as a high-side switch.

* * * * *